US006495917B1

(12) United States Patent
Ellis-Monaghan et al.

(10) Patent No.: US 6,495,917 B1
(45) Date of Patent: Dec. 17, 2002

(54) METHOD AND STRUCTURE OF COLUMN INTERCONNECT

(75) Inventors: John J. Ellis-Monaghan, Grand Isle, VT (US); Paul M. Feeney, Aurora, IL (US); Robert M. Geffken, Burlington, VT (US); Howard S. Landis, Underhill, VT (US); Rosemary A. Previti-Kelly, Burlington, VT (US); Bette L. Bergman Reuter, Essex Junction, VT (US); Matthew J. Rutten, Milton, VT (US); Anthony K. Stamper, Williston, VT (US); Sally J. Yankee, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/527,276

(22) Filed: Mar. 17, 2000

(51) Int. Cl.[7] .............................................. H01L 23/58
(52) U.S. Cl. ..................... 257/758; 257/752; 257/760
(58) Field of Search ............................... 257/737, 748, 257/750, 752, 758, 760, 773, 781, 774, 775

(56) References Cited

U.S. PATENT DOCUMENTS 6,037,668 A * 3/2000 Cave et al. ................... 257/78
6,208,015 B1 * 3/2001 Bandyopadhyay et al. . 257/635
6,222,265 B1 * 4/2001 Akram et al. ................ 257/723
6,313,537 B1 * 11/2001 Lee et al. .................... 257/758

FOREIGN PATENT DOCUMENTS

JP       63179548 A  *  7/1988

OTHER PUBLICATIONS

Planarization of Conductor Surfaces, IBM Technical Disclosure Bulletin, Mar. 1984, vol. 26, No. 10A, p. 4995.
Contactor Lattice for Dislocated C4 Bonds, IBM Technical Disclosure Bulletin, Jul. 1988, vol. 31, No. 2, p. 101–102.
Alternate Chip/Substrate Interconnection Technology, IBM Technical Disclosure Bulletin, Apr. 1992, vol. 34, No. 11, p. 20–21.
Alignment Aid for Stud up Technology, Research Disclosure, Jul. 1989, No. 303, Kenneth Mason Publications Ltd, England.

* cited by examiner

*Primary Examiner*—Minh Loan Tran
*Assistant Examiner*—Thomas L Dickey
(74) *Attorney, Agent, or Firm*—McGinn & Gibb, PLLC; Howard J. Walter, Jr., Esq.

(57) ABSTRACT

A method and structure for a semiconductor chip includes a plurality of layers of interconnect metallurgy, at least one layer of deformable dielectric material over the interconnect metallurgy, at least one input/output bonding pad, and a support structure that includes a substantially rigid dielectric in a supporting relationship to the pad that avoids crushing the deformable dielectric material.

13 Claims, 14 Drawing Sheets

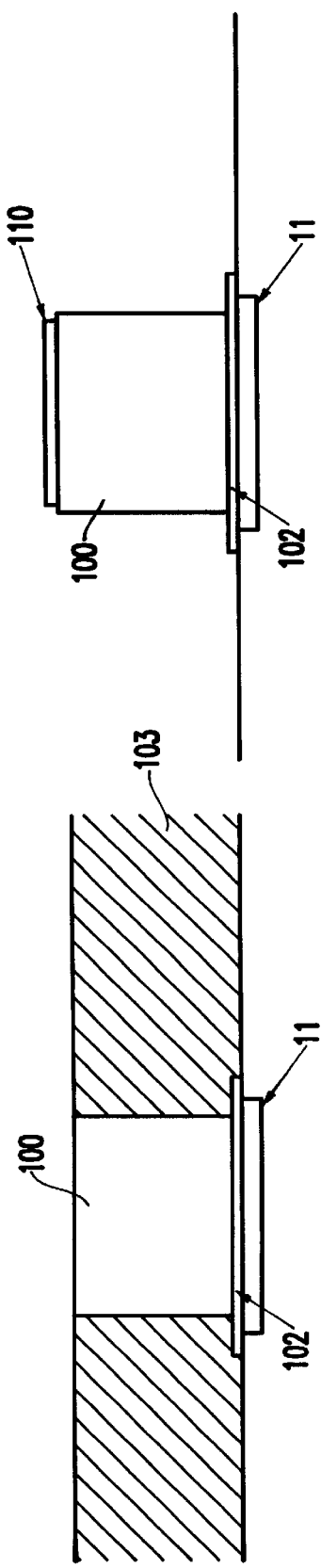
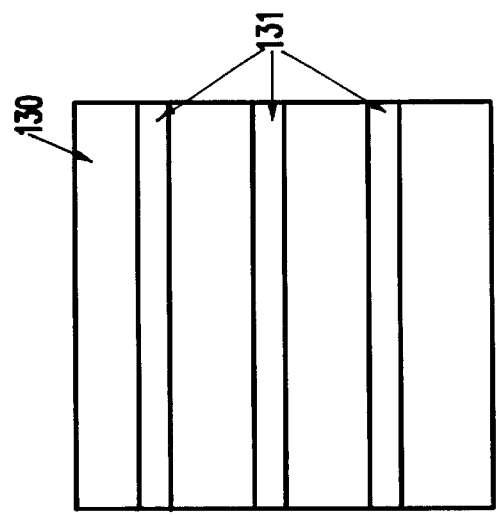
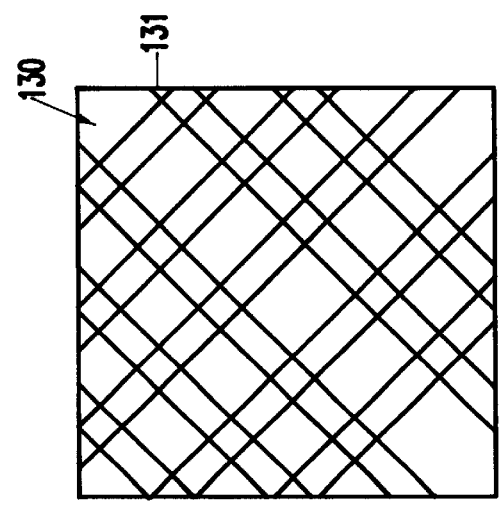

METHOD AND STRUCTURE OF COLUMN INTERCONNECT

BACKGROUND OF THE INVENTION

1. Field of the Invention

The present invention generally relates to semiconductor chips and more particularly to structures which protect the chip during bonding processes.

2. Description of the Related Art

The use of low dielectric potential (k) interlevel dielectric (ILD) materials (e.g., spin-on-glass (SOG), Hydrogensilsesquioxane(HSQ), Methylisilane (MSQ), Benzocyclobutene (BCB), etc.) has become very popular for input/output (UO) and mechanical support structures which are applied to a previously fabricated semiconductor chip. Such I/O and support structures are formed after the logical function sections of the semiconductor chip have been completed. Therefore, such structures/processing are sometimes referred to as "back end of line" (BEOL) structures/ processing because they are formed at the back end of the production line.

However, many low k materials are brittle or soft as compared to silicon dioxide and, when bonding forces are applied, the low k materials can be easily damaged. More specifically, the forces applied during bonding processes (such as ultrasonic wirebonding) or during the formation of solderball (C4) connections, can damage the low k dielectric materials. Thus, the damage from ultrasonic energy (wirebonding), capillary pressure and temperature can weaken or collapse the low k insulator.

Also, ultra low dielectric constant materials (k<3), such as polyarylene ether (trade name SILK manufactured by Dow Chemical, Midland, Michigan, USA, and FLARE manufactured by Honeywell, Sunnyvale, Calif. USA) or silica aerogels, carbon containing CVD dielectrics, Methylsisquoxiane (MSQ), Hydrogen-sisquoxiane (HSQ) have poor mechanical strength as compared to silicon dioxide. Lack of mechanical strength has been a severe problem with connections wirebonded to complimentary metal oxide semiconductors (CMOS) which use ultra w low dielectric constant materials as an intermetal dielectric. Therefore, new processes and structures are needed that will provide compatibility between the low k insulator and the C4/wirebond structures.

Current activity with regard to the above problem includes enhancing the material properties of low k dielectrics (such as processes which increase strength and adhesion), integrating multiple metal films on the copper to provide for compatibility with current C4/wirebond processes, and silicidation of copper to improve nitride adhesion. A recent publication 1998 IEEE 38th Annual IRPS-Reno, Nev., Mar. 31, 1998, p. 225–231, by Mukul Saran et al. (incorporated herein by reference) describes the use of metal grids to provide for mechanical reinforcement of the dielectric stack to eliminate bond-pad damage during wirebonding of Al or Au wires to aluminum pads.

SUMMARY OF THE INVENTION

It is, therefore, an object of the present invention to provide a structure and method for a semiconductor chip that includes a plurality of layers of interconnect metallurgy, at least one layer of deformable dielectric material over the interconnect metallurgy, at least one input/output bonding pad, and a support structure that includes a substantially rigid dielectric in a supporting relationship to the pad that avoids crushing the deformable dielectric material.

The support structure includes a cap over the deformable dielectric material, where the cap is co-planer with the patterned last metal layer or the cap has a thickness greater than that of the patterned last metal layer. The support structure may also include patterned metal layers separated by the rigid dielectric where the patterned metal layers are joined by a plurality of metal connections through the rigid dielectric or may include metallic leg structures extending from the last metal layer into the deformable dielectric material. The leg structures can be a plurality of metallic blocks formed at progressive levels within the deformable dielectric material. The metallic blocks can form a herringbone pattern in cross-section or a step-shaped structure in cross-section.

Another embodiment of the invention is an integrated circuit chip that includes logic circuitry, an external insulator covering the logic circuitry, and a contact over the insulator allowing electrical connection to the logic circuitry. The external insulator includes a first dielectric layer having a first dielectric constant and a support structure having a second dielectric constant higher than the first dielectric constant.

Yet another embodiment of the invention is an integrated circuit chip that includes logic circuitry, an external insulator covering the logic circuitry, and a contact over the insulator allowing electrical connection to the logic circuitry. The contact includes a metallic structure extending above the external insulators. The metallic structure has a pillar or pyramid shape.

Yet another embodiment of the invention is an integrated circuit chip that includes logic circuitry, an external insulator covering the logic circuitry, a contact over the insulator allowing electrical contact to the logic circuitry, and a lattice structure that includes a first dielectric having a first dielectric constant and a second dielectric having a second dielectric constant higher than the first dielectric constant. The lattice structure can be a crisscross pattern of the second dielectric in a layer of the first dielectric, an alternating layer of the first dielectric and the second dielectric, or sidewall spacers of the second dielectric between portions of the first dielectric.

Yet another embodiment of the invention is an integrated circuit chip that includes logic circuitry, an external insulator covering the logic circuitry, and a contact over the external insulator allowing electrical contact to the logic circuitry. The external insulator includes support columns between the logic circuitry and the contact. The support columns are portions of metallization and via levels within the external insulator and can be hollow columns filled with an insulator. The support columns can include heat sinks, and are spaced to permit wiring to be positioned within the external insulator.

The invention overcomes the problems associated with conventional BEOL structures that are discussed above. More specifically, the invention comprises additional structures on top of or within the BEOL structure that add support to the inter-layer dielectric (ILD) during wire or C4 bonding processes.

BRIEF DESCRIPTION OF THE DRAWINGS

The foregoing and other objects, aspects and advantages will be better understood from the following detailed description of a preferred embodiment of the invention with reference to the drawings, in which:

FIG. 10 is a schematic diagram of an inventive bond pad containing a metal pillar;

FIG. 11 is a schematic diagram of the structure shown in FIG. 10 etched;

FIG. 12 is a schematic diagram of a single level of mixed dielectric materials for the base and the lattice;

FIG. 13 is a schematic diagram illustrating an inventive crisscross pattern of lattice;

FIG. 14 is a schematic diagram illustrating single lines of different dielectrics;

DETAILED DESCRIPTION OF PREFERRED EMBODIMENTS OF THE INVENTION

The invention overcomes the problems associated with conventional BEOL structures that are discussed above. More specifically, the invention comprises additional structures on top of or within the BEOL structure that add support to the inter-layer dielectric (ILD) during wire or C4 bonding processes.

Figure 1:
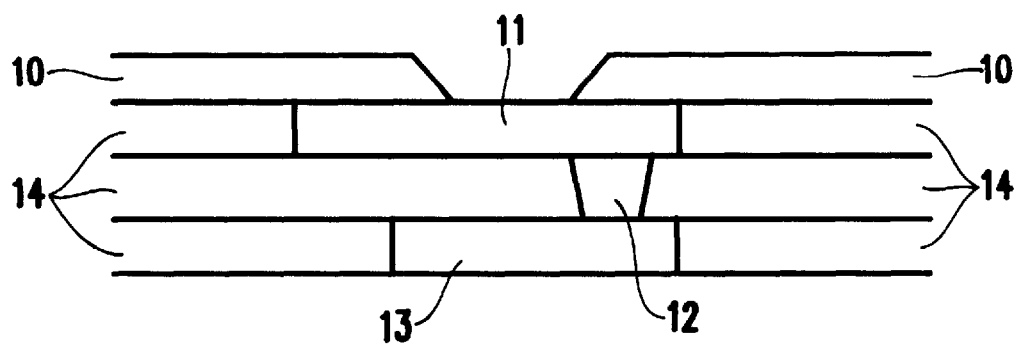
FIG. 1 is a schematic diagram of the inventive cap above last metal (LM) level.

A first embodiment of the invention is illustrated in FIG. 1 and includes a last metallization layer (LM) 11, a second to last metallization layer (LM-1) 13, a conductive via 12 connecting the two metallization layers 11, 13, and inter-layer dielectrics 14 which provide electrical insulation, but are too fragile to provide adequate mechanical support. In addition to the conventional structure, the invention includes a protective cap 10.

The invention adds the protective cap 10 above the last metallization (LM) layer 11. The thickness of the cap 10 is between 1 and 20 microns, and is preferably 10 microns thick. The cap 10 can be formed of, for example, silicon dioxide ($SiO_2$), (spin-on-glass) SOG, silicon nitride, doped $SiO_2$ (i.e. F, B, P), HSQ, MSQ or other similar protective substance. The preferred embodiment would comprise 50 $\mu$m nitride, 1 $\mu$m oxide, 1 $\mu$m nitride, 1 $\mu$m oxide (nitride= $Si_xN_yH_z$ an oxide=$SiO_2$), but could be any similar structure. Note the initial 50 $\mu$m of nitride is only required if the oxide has poor adhesion to the last metal and the last 10 $\mu$m of oxide could be any dielectric with good mechanical properties.

Figure 2:
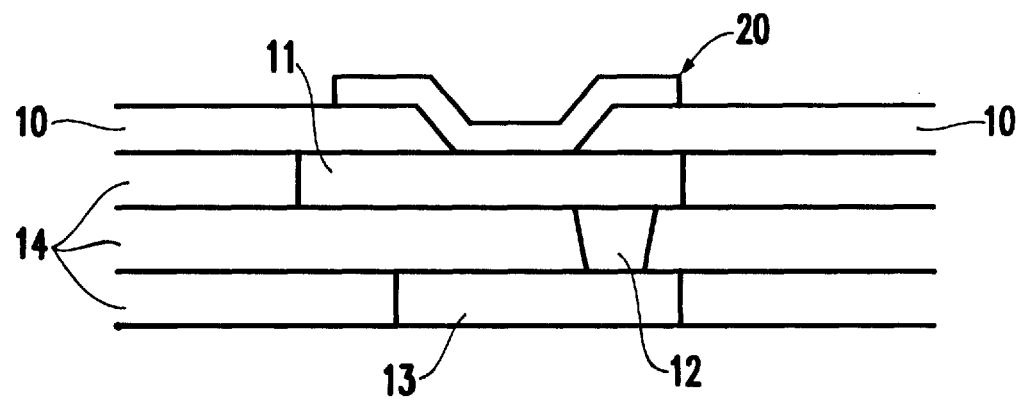
FIG. 2 is a schematic diagram of the inventive cap above LM level with Pad.

The cap 10 is deposited above the LM layer 11 using standard deposition techniques such as sputtering, chemical vapor deposition (CVD), etc. In addition, a conductor pad 20 can be deposited, as shown in FIG. 2. The pad 20 comprises any standard metal, such as Al (99.5%) Cu (0.5%), which can be deposited and patterned. Preferably, the pad 20 will comprise a stack of 50 $\mu$m TaN, 3 $\mu$m Al (99.5%) Cu (0.5%), and 100 $\mu$m TiN. The structure is thus prepared for wirebonding or C4 bonding processes.

Standard final passivation oxide/nitride is typically under 1 $\mu$m thick while the cap, 10, is preferably greater than 10 $\mu$m thick. The relatively thick cap layer, 10, provides a rigid surface to absorb the forces associated with wirebonding, solder bumping, packaging etc.

Figure 3:
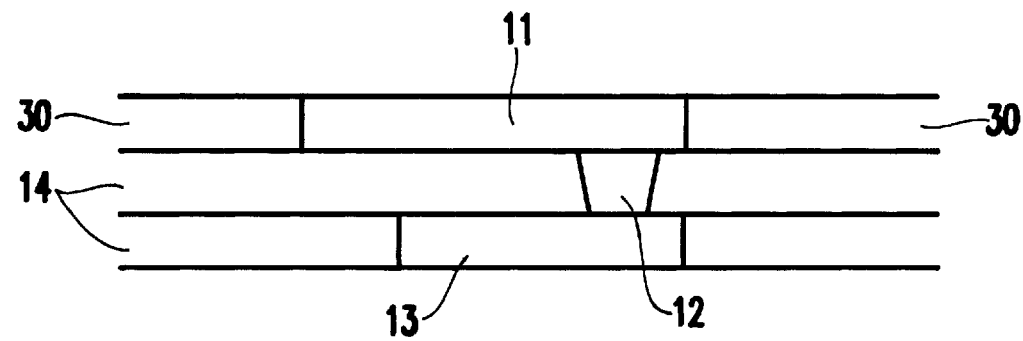
FIG. 3 is a schematic diagram of the inventive cap at LM level coplanar with LM having a thickness equal to LM.
Figure 4:
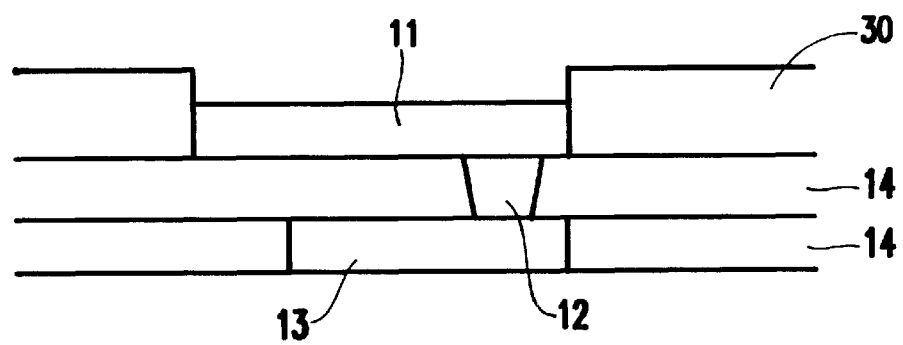
FIG. 4 is a schematic diagram of the inventive cap coplanar with LM level with a thickness greater than that of LM.

Another embodiment is shown in FIG. 3. In this embodiment the cap 30 is formed at the LM 11 level. A damascene or other similar process could be used to build LM 11 into the cap 30. In this embodiment, the cap 30 becomes part of the last level dielectric. This embodiment adds a shock absorbing layer 30 co-planer to the last level of metal 11. Therefore, this embodiment could be used alone to produce a stronger structure which has the same topography or combined with the structure shown in FIG. 2. The LM 11 level may be the same thickness as the cap 30 or thicker, as shown in FIG. 4.

Figure 5:
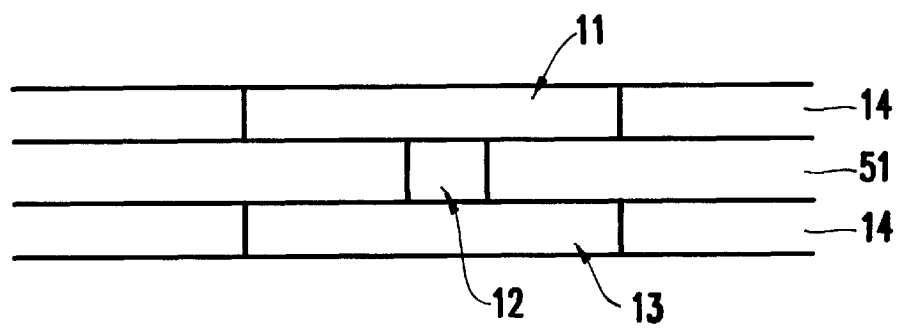
FIG. 5 is a schematic diagram of the inventive cap between LM-1 and LM and a rivet design.

An additional embodiment, which is illustrated in FIG. 5, includes a cap 51 located between LM-1 and LM. This is a "rivet" design where LM-1 is attached to LM with the conductive metal (stem) 12. The cap 51 layer is between the base 13 and head 11 of the rivet, as shown in FIG. 5. A damascene process is preferably used to form the cap 51 and rivet 52 structure; however, as would be known by one ordinarily skilled in the art given this disclosure, any similar process could be used. The LM 11 and associated ILD 14 are preferably prepared after forming the cap 51, using standard metal deposition techniques. This embodiment would allow the last metal, 12 to be fabricated in a low k dielectric.

Figure 6:
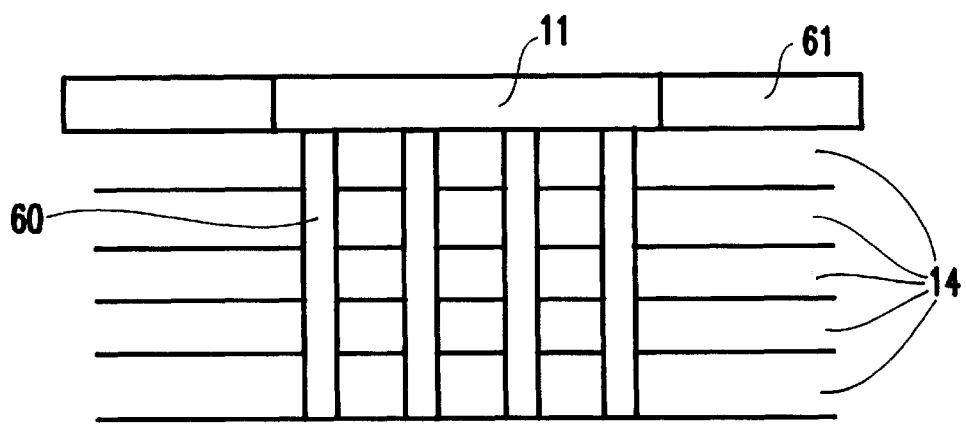
FIG. 6 is a schematic diagram of the inventive cap with legs.
Figure 7:
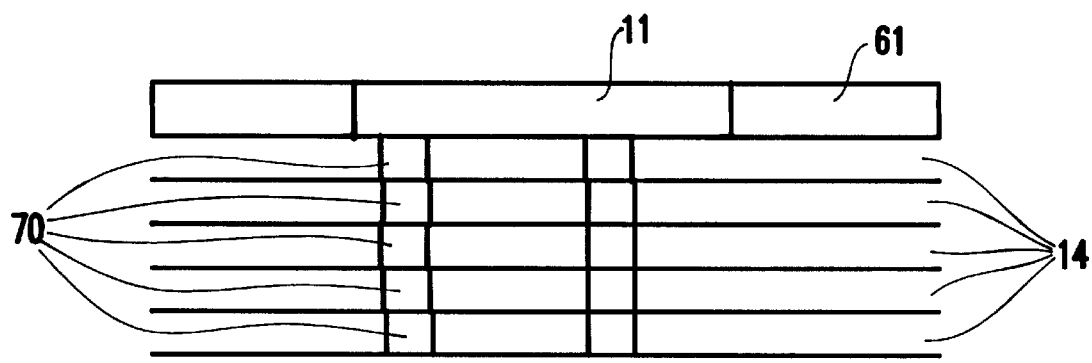
FIG. 7 is a schematic diagram of an inventive vertical stack.
Figure 8:
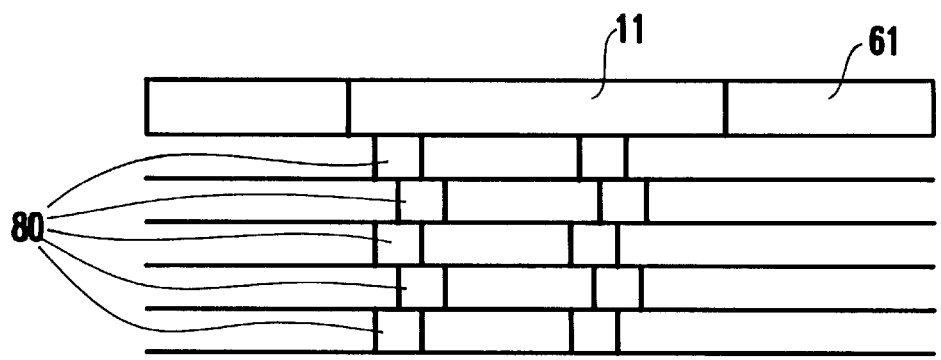
FIG. 8 is a schematic diagram of an inventive herringbone stack.

Another embodiment of the invention comprises a cap and leg structure, as show in FIG. 6. Support structures (legs) 60 are preferably formed of materials similar to the cap 61. The legs 60 may be formed by etching a deep via/hole and filling the hole with the cap 61 material. Alternatively, as illustrated in FIGS. 7–9 the legs 70, 80, 90 are formed by placing a stud of material at each level so as to build a stacked building block structure.

Figure 9:
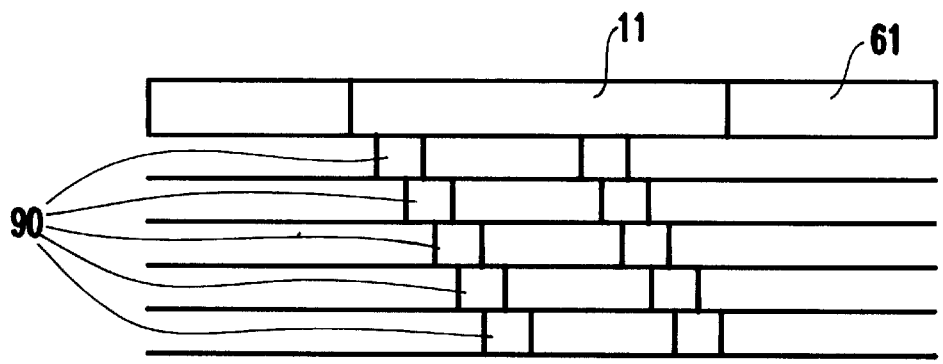
FIG. 9 is a schematic diagram of an inventive staircase stack.

The building blocks may be stacked directly on top of one another (see FIG. 7), in a herringbone pattern (see FIG. 8), or as a step-like stack (see FIG. 9). As would be known by one ordinarily skilled at in the art, the placement of the building blocks is controlled by modifying the deposition/etching process of each successive layer.

Using this embodiment, the leg structures 90 can be located anywhere that design requirements allow so as not to interfere with BEOL structures. The legs provide a rigid path from the last metal pad surface to the silicon substrate. This rigid "table" supports the last metal pads, which are fabricated over the low k dielectric.

Another embodiment of the invention comprises a design for a metal bond pad that dissipates the forces that develop during wirebonding or C4 joining that can damage fragile low k dielectric materials. As shown in FIG. 10, this embodiment of the invention includes a structure 100 which may be a circular, square or other shaped pillar of metal and is located above the LM or bond pad 11. Wirebonding or C4 bonding will occur at this structure 100 which will act to dissipate or absorb the forces associated with the bonding process.

More specifically, the pillar of metal 100 (e.g., copper, aluminum, or tungsten) is built onto the previously formed bond pad 11, as shown in FIG. 10. An interface metal film/pad 102 may be deposited if necessary to attach the pillar 100 to the LM or bond pad 11.

The pillar 100 could be formed using any number of well-known process. For example, a film (e.g., 0.1 to 50 $\mu$m thickness, preferably 10 $\mu$m) of sacrificial masking material 103 could be deposited. This masking material 103 may be a photoresist, polyimide, photo-polyimide, etc. Photolithographic and etching techniques (dry, wet) could be used to pattern the mask film 103 so as to expose the areas where the metal pillars 100 are to be located. The metal pillar 100 material is deposited using sputtering or evaporation techniques. The mask material 103 may be removed using wet chemical or dry etch techniques. An additional metal pad or interface metal 110 may be added to the top of the metal pillar 100 to allow for better adhesion to the bonding material, as shown in FIG. 11. The pillar prevents probes from protruding into the low k dielectric through the next level 11.

The next embodiment, which is illustrated in FIG. 12, includes a lattice structure 131 which is built into the BEOL structure 130. The lattice structure 131 comprises standard, higher k dielectrics (e.g., $SiO_2$, P, B, F, etc. doped glass, $Si_xN_yH_z$, $Si_xC_yH_z$ and may be designed into one or several levels of the BEOL. The invention can be mixed and matched with varying dielectric materials within the BEOL to maximize the desired properties of the ILD and support lattice. The lattice lines may be placed in any pattern. For example, FIG. 13 illustrates a crisscross pattern of a lattice and FIG. 14 illustrates single lines of different dielectric.

While the lattice structure 131 will increase the effective dielectric constant k of the BEOL structure, it also acts as a rigid frame to prevent damage to the fragile low k dielectric, 131, during subsequent processing, testing, wirebonding, solderball bumpint, packaging, etc.

Figure 15:
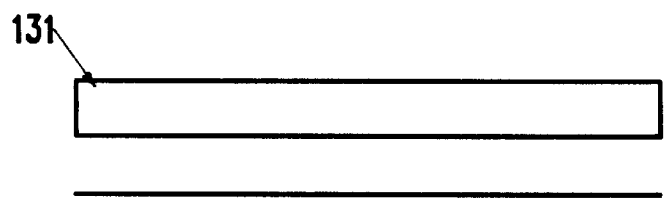
FIG. 15 is a schematic diagram of the beginning phase of building the inventive lattice.
Figure 16:
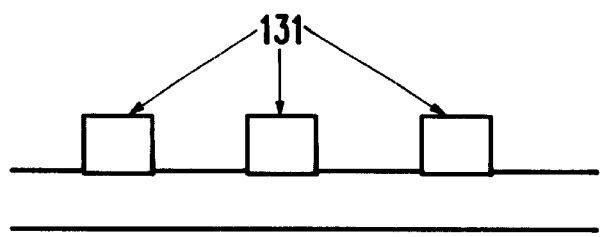
FIG. 16 is a schematic diagram of the inventive lattice structure formed.
Figure 17:
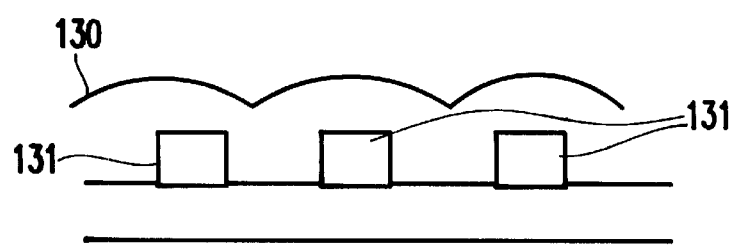
FIG. 17 is a schematic diagram of another phase of building the inventive lattice building.
Figure 18:
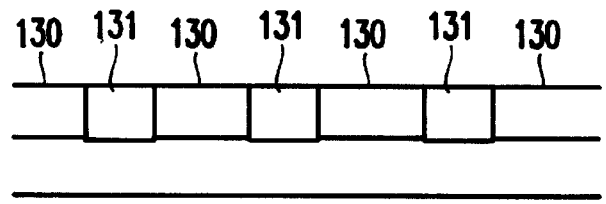
FIG. 18 is a schematic diagram of the last phase of building the inventive lattice.

This embodiment can be formed using a number of conventional processes, as would be known by one ordinarily skilled in the art given this disclosure. For example, a film of higher k 131 dielectric can be deposited, as shown in FIG. 15. Using photolithographic or other similar techniques, the lattice structure could be defined, as shown in FIG. 16. The low k material 130 is deposited and planarized (using, for example, chemical mechanical polishing (CMP)) or etched as shown in FIG. 17 and FIG. 18, respectively. Alternatively, the low k dielectric 130 can be patterned and the standard dielectric 131 can be deposited and planarized. Additionally, a hard mask may be used on top as an etch or CMP stop, if necessary.

Figure 19:
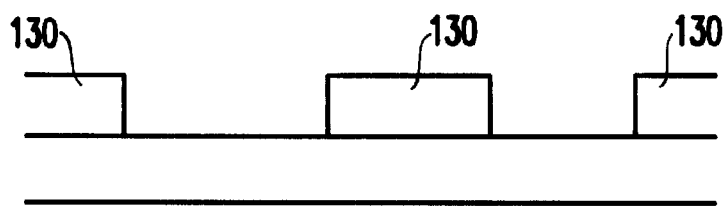
FIG. 19 is a schematic diagram of the beginning phase of fabricating inventive lattice structure.
Figure 20:
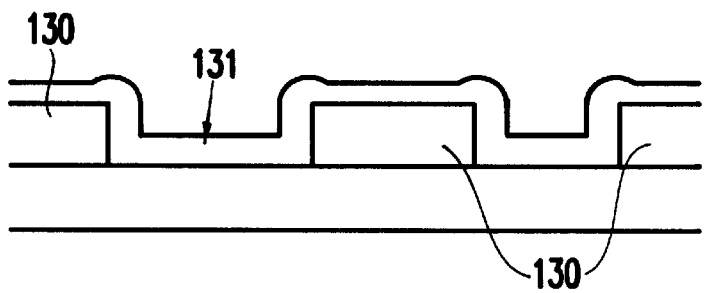
FIG. 20 is a schematic diagram of the inventive lattice structure.
Figure 21:
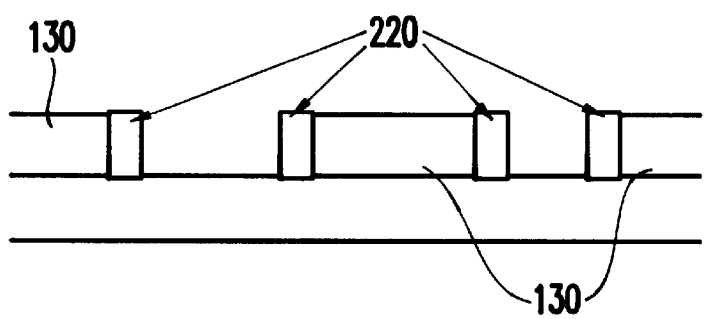
FIG. 21 is a schematic diagram of the inventive lattice structure.
Figure 22:
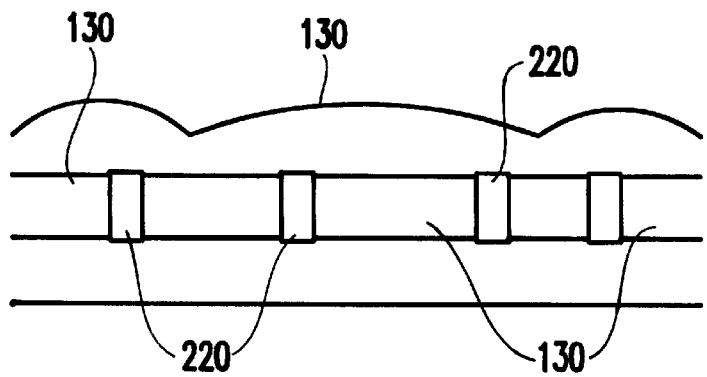
FIG. 22 is a schematic diagram of the inventive lattice structure.
Figure 23:
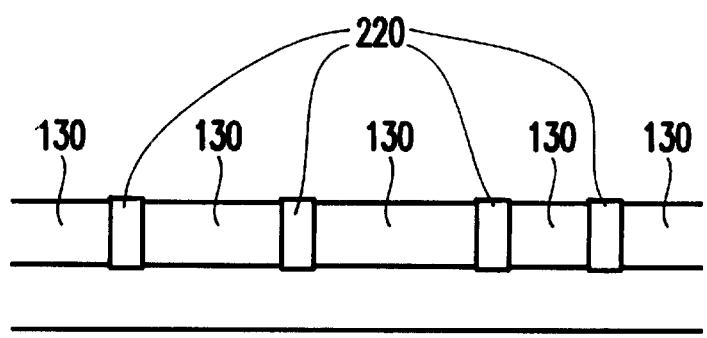
FIG. 23 is a schematic diagram of the inventive lattice structure.

Also, this embodiment may be formed by depositing and patterning the low k 130 dielectric (i.e. spin-on photoresist, pattern the photoresist, etch the dielectric 131, strip the photoresist), as shown in FIG. 19. A standard high k plasma CVD or PVD dielectric material 131 is deposited to conform to the pattern, as shown in FIG. 20. Anisotropic dry etching etches the standard dielectric 131, leaving a sidewall 220 of standard dielectric which becomes the lattice, as shown in FIG. 21. More low k dielectric 130 is redeposited to fill the pattern, as shown in FIG. 22, followed by a planarization etch or CMP, as shown in FIG. 23. Again, a hard mask may be used as an etch or CMP stop.

Figure 24:
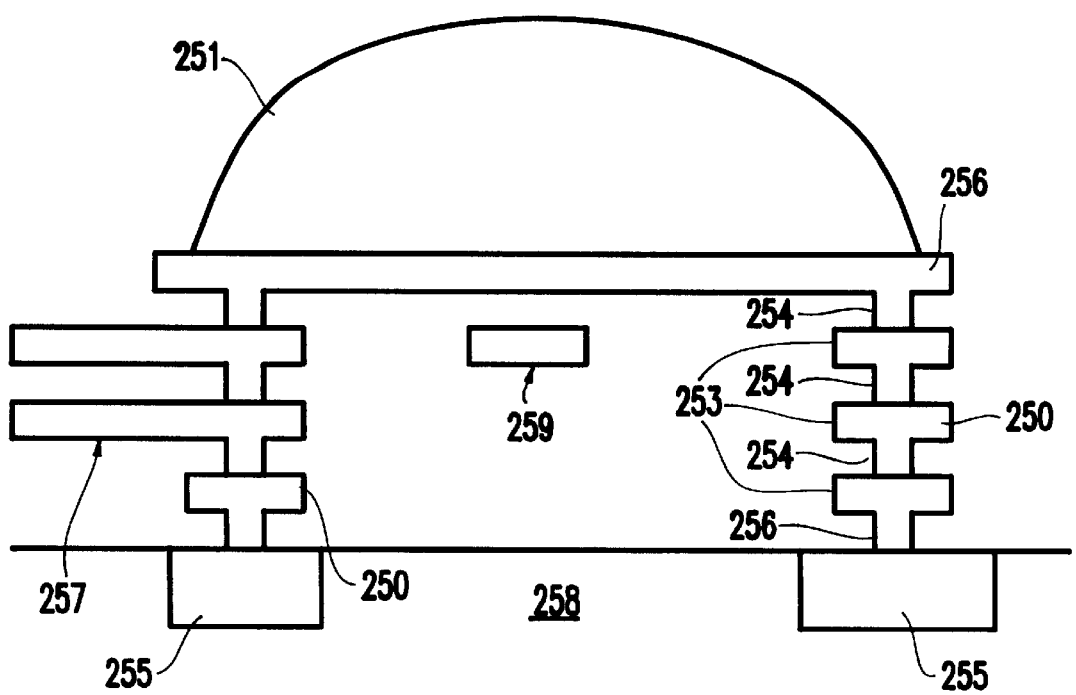
FIG. 24 is a schematic.diagram illustrating the inventive metal columns.

Another embodiment, which is illustrated in FIG. 24, is a series of stacked metal fill shapes (e.g., columns) 250 which support a C4 251 or wirebond pad 256. These metal columns 250 include a series of metal studs which are formed at the contact 252, metal 253 and via levels 254. The initial stud formed at the contact level 252 is placed above the shallow trench isolation (STI) 255 or on the inorganic dielectric using tungsten vias/interconnects and/or local interconnects (i.e. BPSG, PSG, $SiO_2$, $Si_xN_xH_z$, $Si_xC_yH_z$, etc.). The columns 250 continue to the final pad 256, providing mechanical stability of the pad structure.

The columns are positioned in areas that would allow wires 259 to pass under the pad 256. Thus, the invention does not limit the ability of the wire 259, yet provides for a robust C4 structure 251, as shown in FIG. 24.

Figure 25:
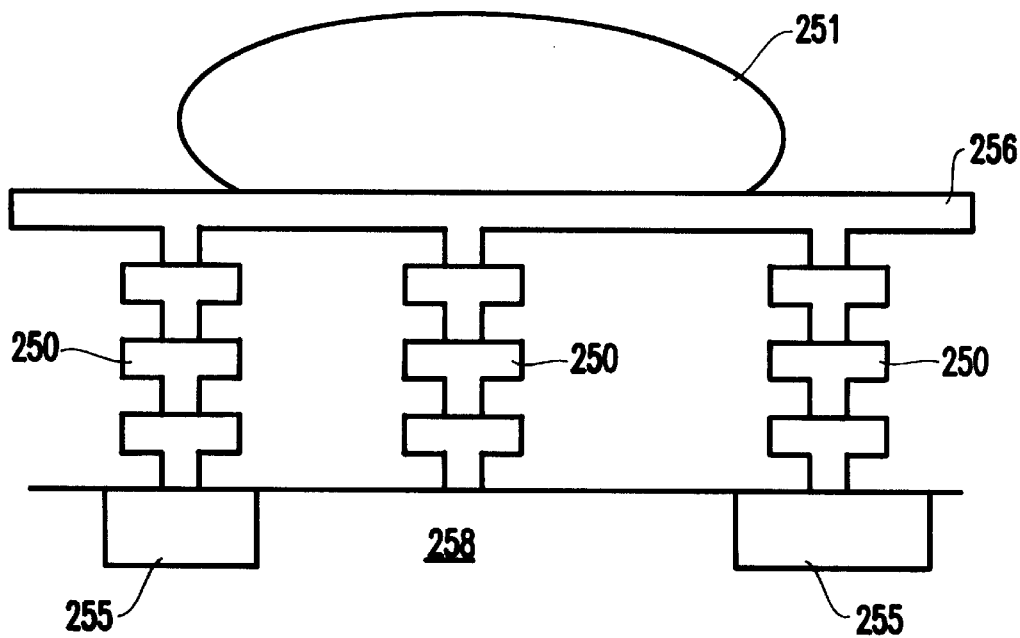
FIG. 25 is a schematic diagram illustrating the inventive bond pad column supports.

The metal columns 250 are compatible with a dual damascene process. The vias associated with the metal column could be any size and are preferably 2 microns or larger in diameter. In addition to providing mechanical strength, metal runners 257 could be formed during the formation of the metal levels 253. The runners gather heat and dissipate the heat through the C4 pad 251. The runners 257 are metal lines that extend beyond the columns 250 (where allowed by the design) to act as heat sinks. Further, bar bias (e.g., vias with length to width ratio greater than 2) could be employed to maximize the stabilizing area. As shown in FIG. 25 the columns can be spaced appropriately so as to allow for adequate mechanical strength.

Figure 26:
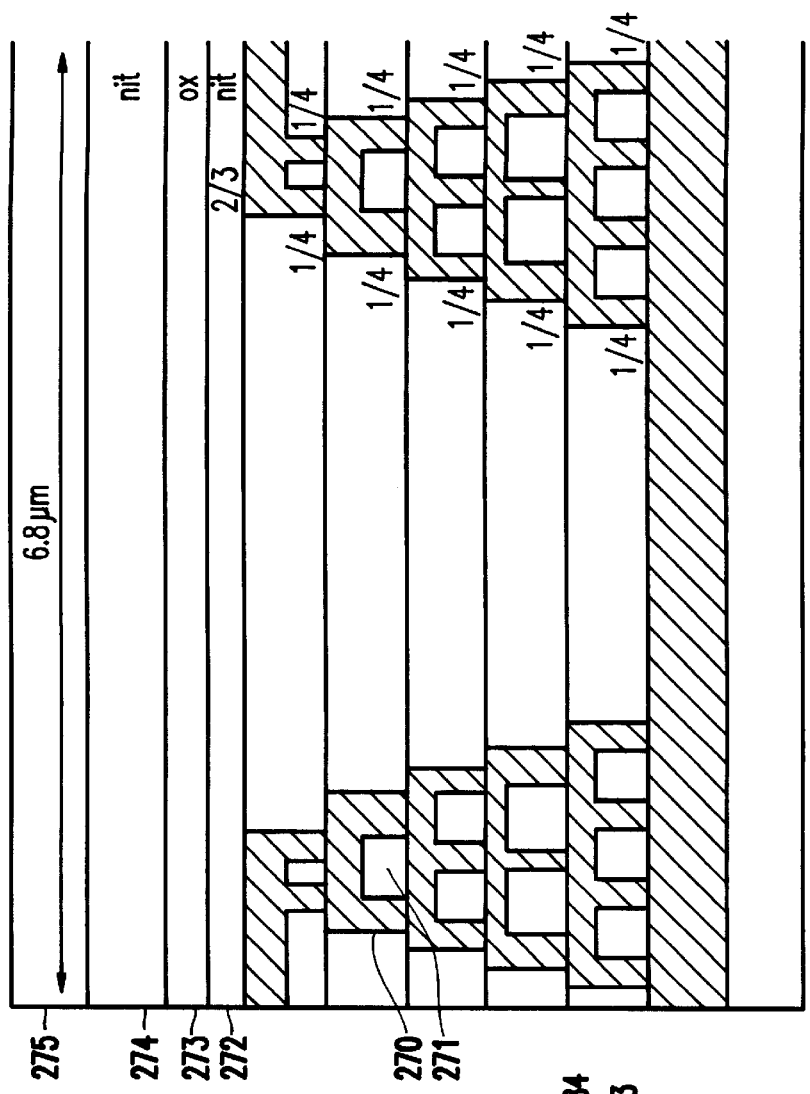
FIG. 26 is a schematic diagram of the inventive bond pad column supports.
Figure 27:
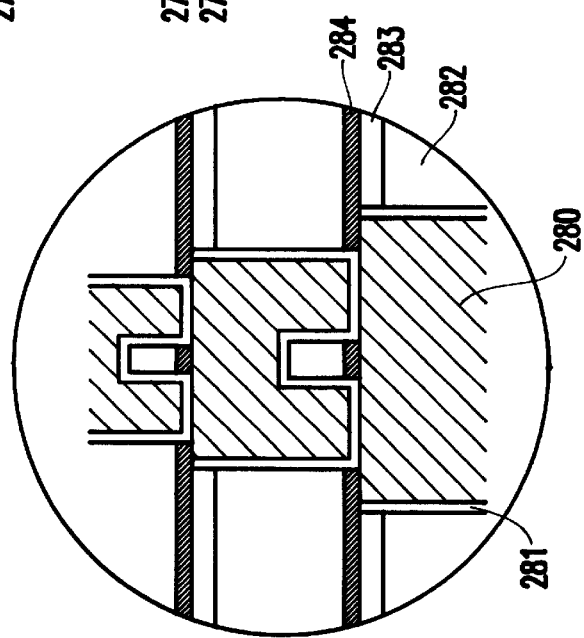
FIG. 27 is an enlarged schematic diagram of the inventive bond pad column supports.

Another embodiment, shown in FIG. 26 includes "composite" columns 270 which have a "staircase" structure formed using the methods discussed above. The "composite" columns 270 build a metal casing around a low k dielectric, 271, as part of the standard wire and vias. The structure shown in FIG. 27 is capped by a series of insulator layers, such as nitride layer 272, oxide layer 273 and nitride layer 274. Layer 275 could be another insulator, a resist, the pad, etc.

As shown in greater detail in FIG. 27, each of the "stairs" of the composite columns 270 includes a metallic (e.g., Cu, Al, etc.) step portion 280 and a liner 281 (e.g., Ta, Ti, W, including nitridized or silicon doped alloys etc.), surrounded by alternating layers of a low k dielectric 282, a standard insulator (e.g., $SiO_2$, $Si_xN_yH_z$, $Si_xC_yH_z$, etc. 283) and Nitride, $Si_xN_yH_z$, $Si_xC_yH_z$, etc. 284. Note the inorganic insulators 283,284 are used in conjunction with a polymer low k dielectric and are not required for all low k dielectrics.

These composite column structures 270 could also be used as heat sinks. This is important if the low k dielectric is a poor thermal conductor. These composite column structures: 270 consume relatively small areas of the chip, as shown in Table 1.

TABLE 1

Figure 28:
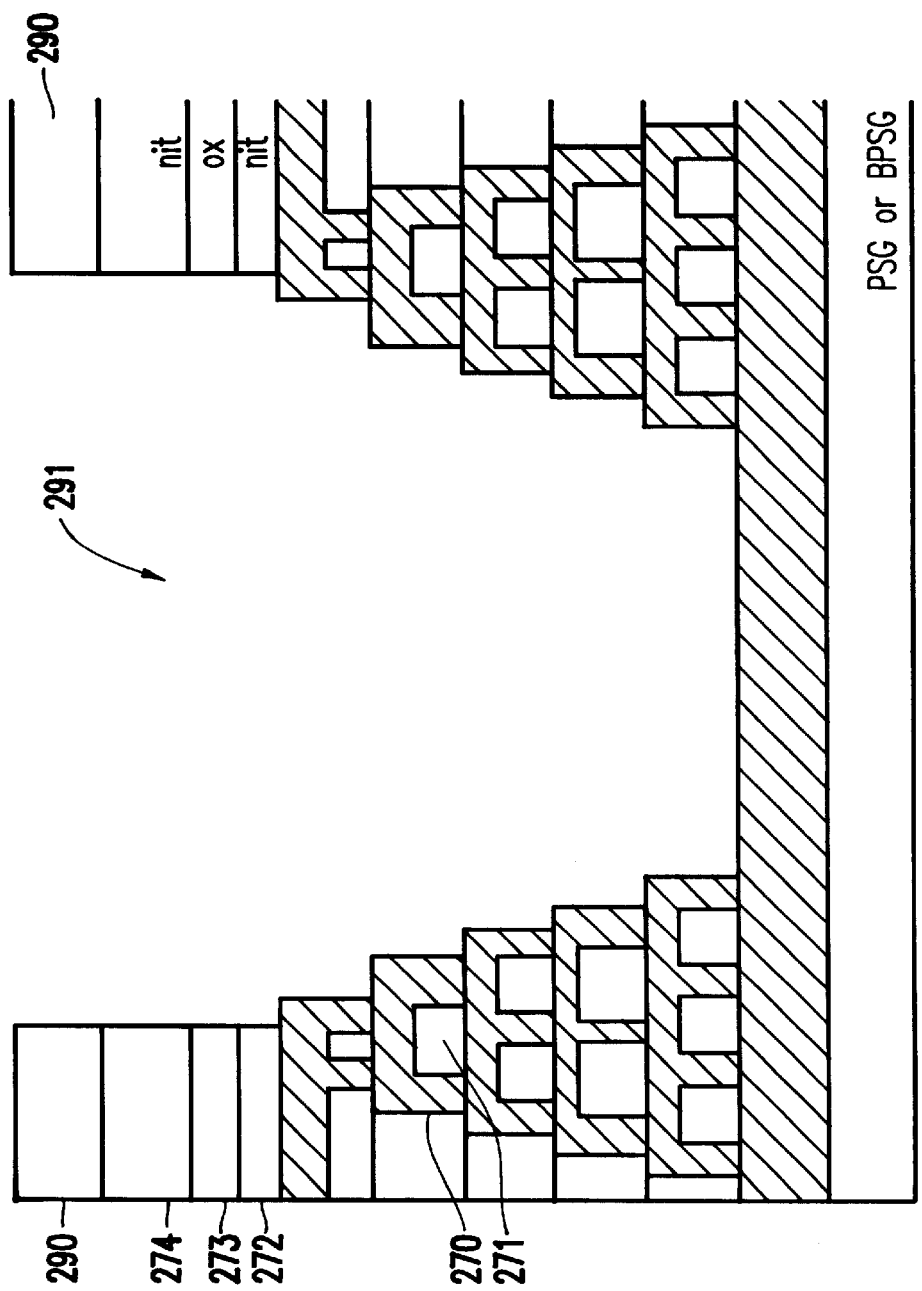
FIG. 28 is a schematic diagram of the inventive bond pad column supports.
Figure 29:
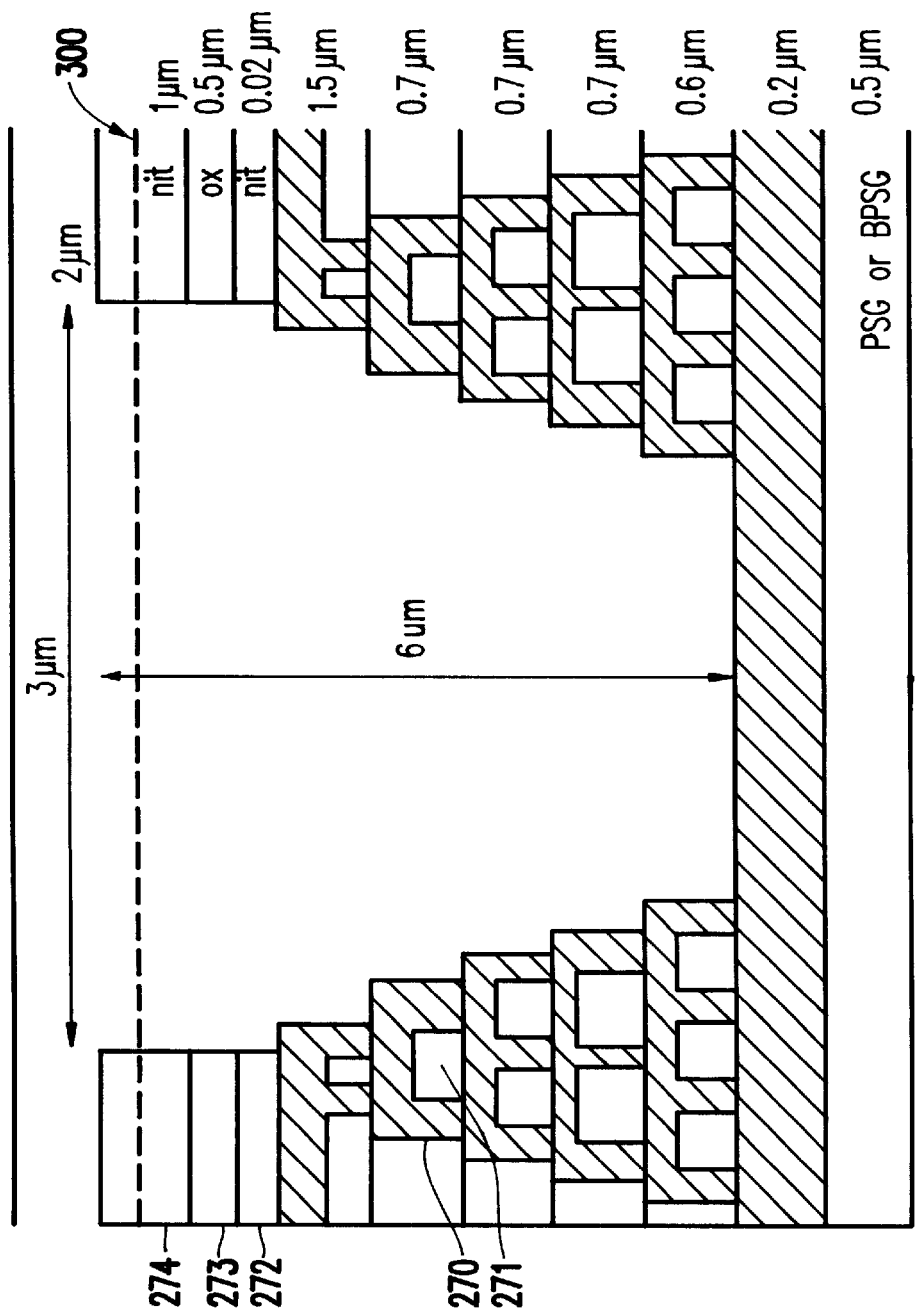
FIG. 29 is a schematic diagram of the inventive bond pad column supports.

| Embodiment Columns | @ Pads | Chip Area | Column Area | No. of Columns/Pad | % M1–M6 Used By Columns |
|---|---|---|---|---|---|
| FIG. 25–26 | 10,000 | 1 cm² | 4 μm² | 20 | 0.8% |
| FIG. 27–29 | 10,000 | 1 cm² | 46 μm² | 5 | 2.3% |

Figure 30:
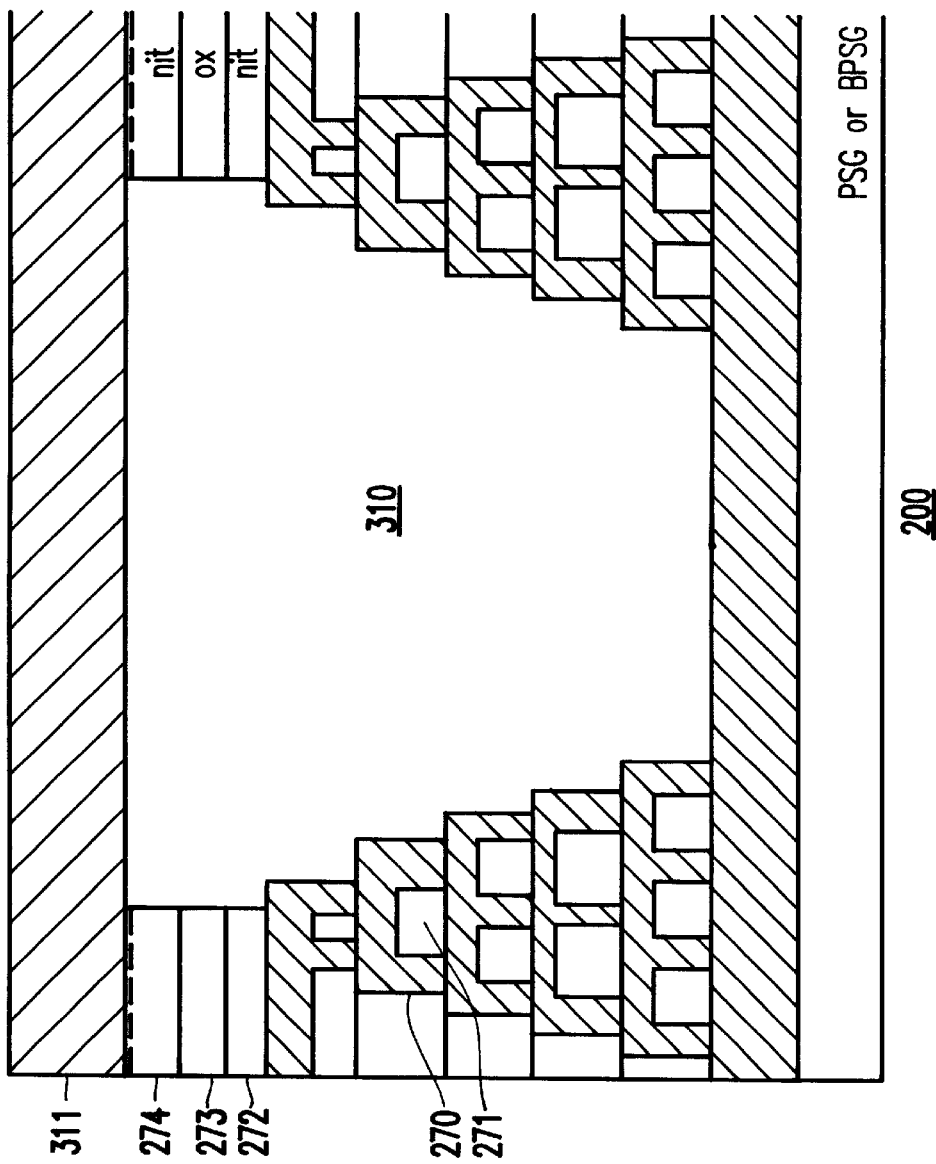
FIG. 30 is a schematic diagram of the inventive bond pad column supports.

FIG. 28 illustrates a resist 290 which is used to remove the low k dielectric from the region 291. Then, FIG. 29 shows one example of the relative dimensions of the various structures shown in FIGS. 27 and 28. In FIG. 29, the resist 290 and a portion of the nitride layer 274 are etched down to point 300. Then, in FIG. 30, the opening 291 is filled with a rigid substance such as hard spin-on-glass 310 and a pad 311 is formed over the structure. The spin-on-glass (or other rigid material) adds to the mechanical strength of the column structure.

Figure 31:
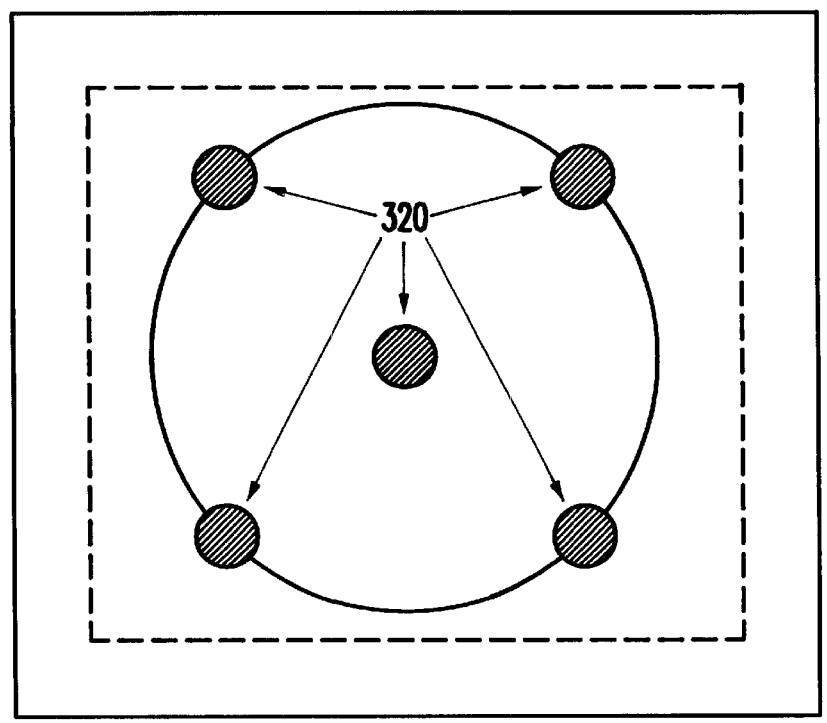
FIG. 31 is a schematic diagram of a cross-section of the inventive bond pad column supports.

FIG. 31 illustrates a top-view of a five column support 320, which can be any of the inventive columns mentioned above, such as those shown in FIG. 26. The positioning of the columns 320 is selected to maximize the strength of the structure. While one example is shown in FIG. 31, as would be known by one ordinarily skilled in the art in light of this disclosure, different patterns of columns may be used to alter the strength of the structure.

Figure 32:
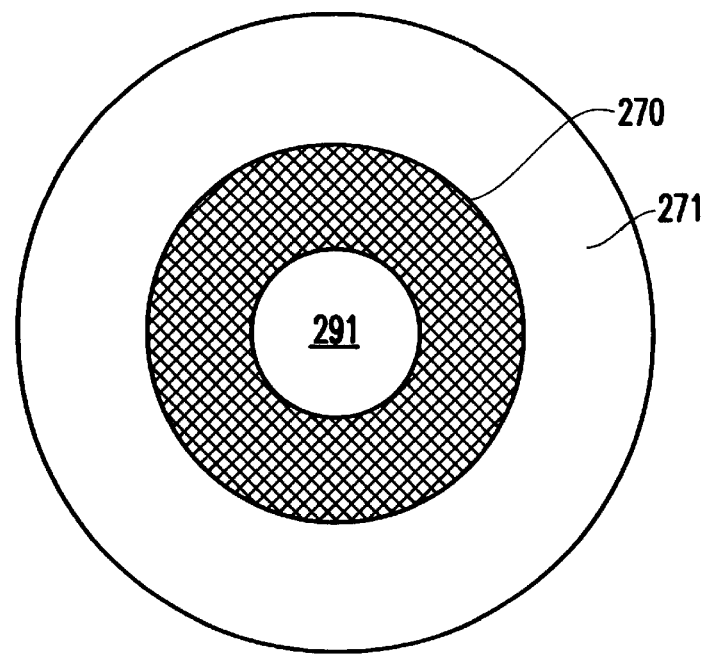
FIG. 32 is an enlarged schematic diagram a cross-section of the inventive bond pad column supports.

FIG. 32 illustrates a top view of one of the columns (e.g., such as the columns shown in FIG. 26). For example, the spin-on-glass portion 291 occupies the center, the copper portion 270 surrounds the spin-on-glass 291 and the low k dielectric 271 forms the outer portion.

Figure 33:
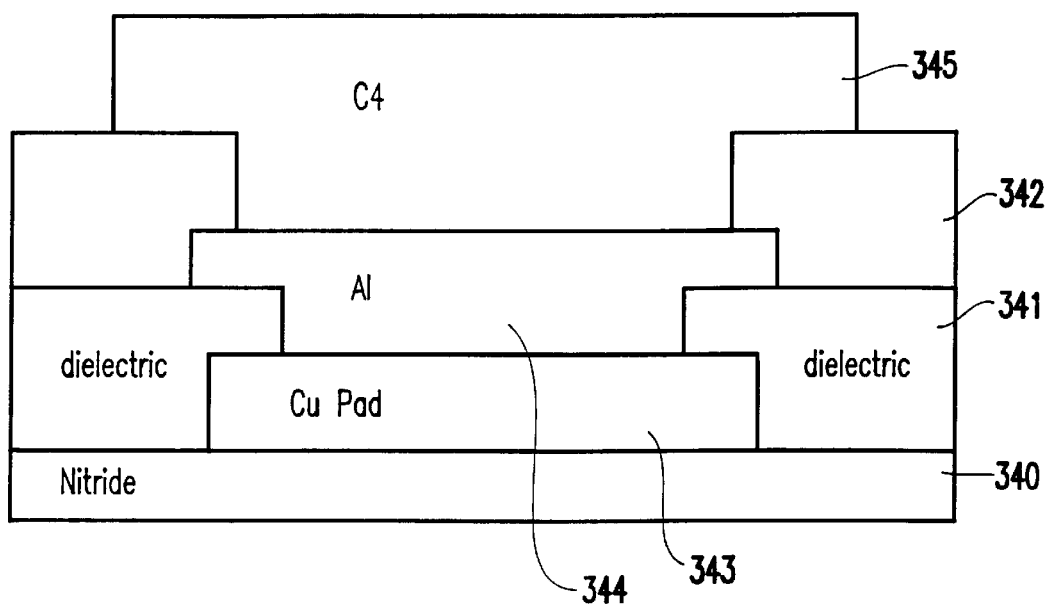
FIG. 33 is a schematic diagram showing an example of a structure with an additional metal layer between the copper pad and the last level of copper.
Figure 34:
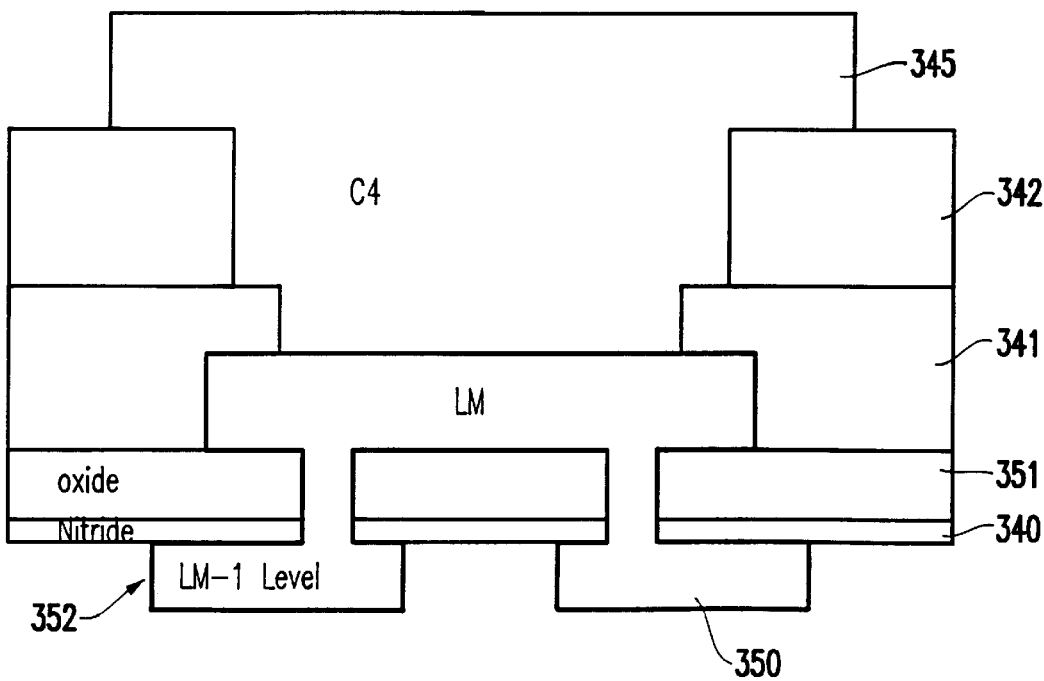
FIG. 34 is a schematic diagram showing a structure which eliminates the additional metal layer shown in FIG. 34.

Referring now to FIGS. 33 and 34, the use of the invention to eliminate an additional metal layer is illustrated. More specifically, the structure in FIG. 34 includes a barrier dielectric 340 (such as a nitride dielectric), dielectric layers 341, 342, a pad layer 343 (such as a copper pad), and a solderball C4 wiring layer 345. In addition, the structure shown in FIG. 34 includes a metal layer 344 (e.g., aluminum) above the pad layer 343. The notched shape of the metal layer 344 helps maintain the pad 343 against the barrier dielectric 340. To the contrary, in FIG. 34 the anchored structure 350 (e.g., last metallization and second to last metallization layer, which can be formed as discussed in FIG. 5 above) replaces the pad 343 and the notched metallization layer 344. This simplifies the structure, makes it smaller and lighter, and reduces the processing time and complexity. In addition, the structure shown in FIG. 34 includes an oxide layer 351 which further strengthens the structure. The "root" 352 lengths and orientation can be modified to achieve the desired adhesive strength for different pad structure topologies.

Figure 35:
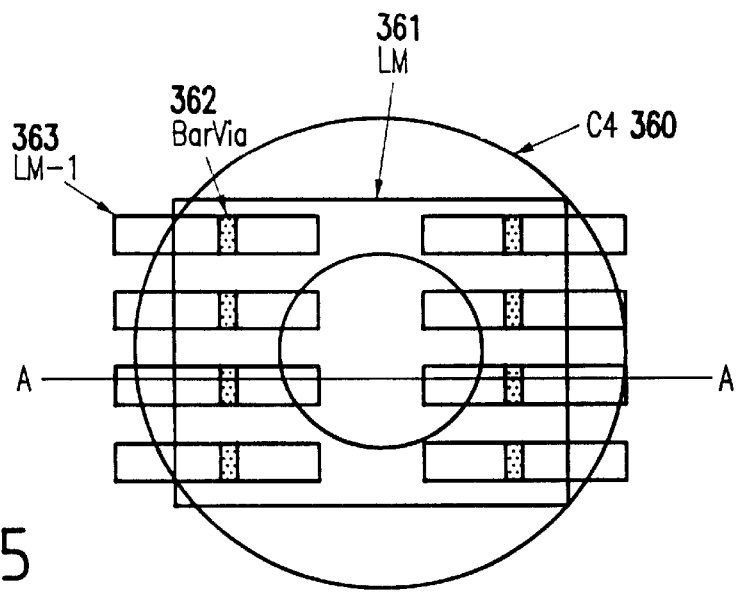
FIG. 35 is a schematic diagram of a top view of the spacing achieved between roots to provide wiring channels according to the invention.
Figure 36:
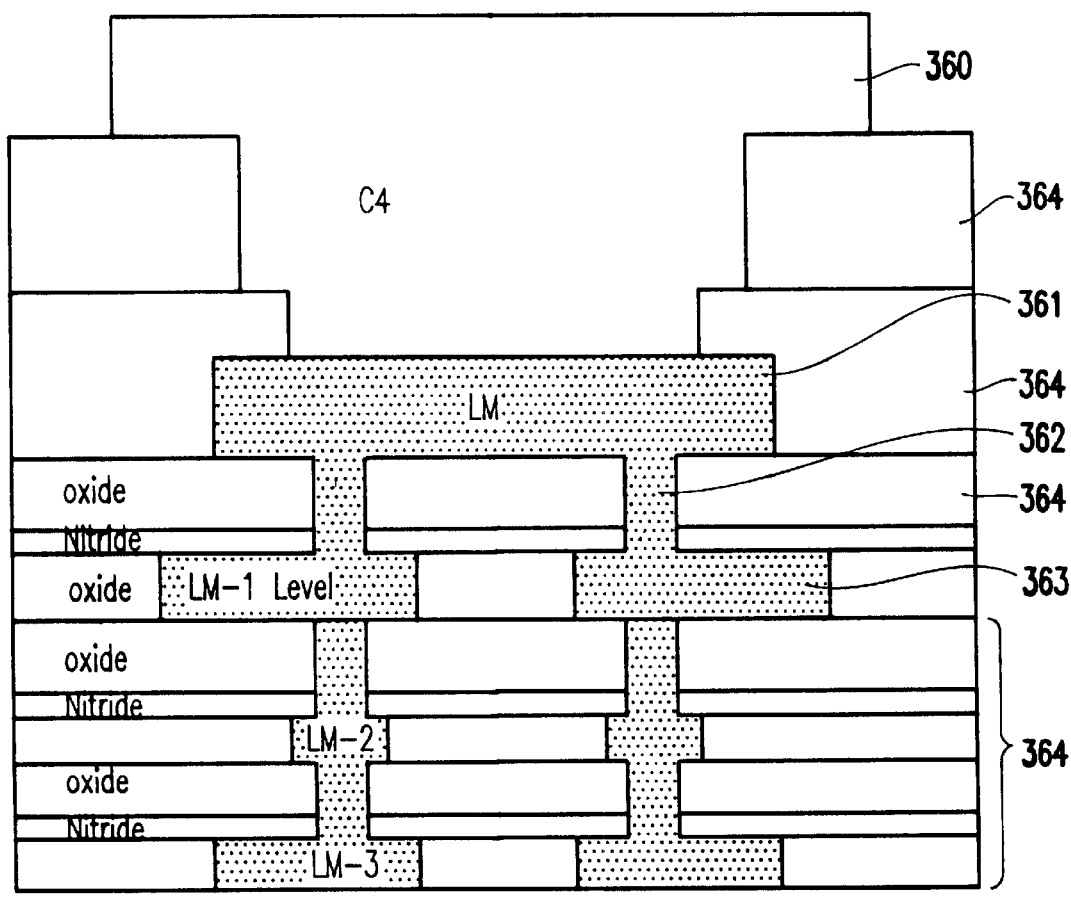
FIG. 36 is a schematic diagram of a high adhesion structure according to the invention.

Referring now to FIGS. 35 and 36, another embodiment of the invention is illustrated. More specifically, FIG. 35 illustrates a top view of the structure and FIG. 37 illustrates a cross sectional view of the structure along lines A—A of FIG. 35. The C4 structure is shown as item 360, the last metallization layer is shown as item 361, the next to last metallization layer is shown as item 363, and the bar via connecting the last metallization layer 361 to the second to last metallization layer 363 is shown as item 362 in FIGS. 35 and 36. In addition, FIG. 36 illustrates various dielectric insulating layers 364 which are utilized as discussed in the foregoing embodiments. As discussed in the previous embodiments, this structure provides a superior adhesion strength between the last metallization layer 361 and the adjacent dielectric.

Therefore, the invention provides many alternatives for increasing the adhesive strength between the last metallization layers and the adjacent dielectric. As would be known by one ordinarily skilled in the art given this disclosure, the invention is not limited to the structures disclosed above. Instead, the invention comprises any similar structure which utilizes any version of the supporting structure described above. Therefore, while the invention has been described in terms of preferred embodiments, those skilled in the art will recognize that the invention can be practiced with modification within the spirit and scope of the appended claims.

What is claimed is:

1. A semiconductor chip comprising:

a plurality of layers of interconnect metallurgy;

at least one layer of deformable dielectric material over said interconnect metallurgy;

a support structure comprising a substantially rigid dielectric connected to said deformable dielectric; and at least one input/output bonding pad connected to said support structure, wherein said support structure is in a supporting relationship to said pad to avoid crushing said deformable dielectric material, wherein said support structure comprises a cap over said deformable dielectric material, and wherein said support structure includes a patterned last metal layer of said interconnect metallurgy and said cap is co-planer with said patterned last metal layer.

2. A semiconductor chip comprising:

a plurality of layers of interconnect metallurgy;

at least one layer of deformable dielectric material over said interconnect metallurgy;

a support structure comprising a substantially rigid dielectric connected to said deformable dielectric; and at least one input/output bonding pad connected to said support structure, wherein said support structure,is in a supporting relationship to said pad to avoid crushing said deformable dielectric material, wherein said support structure comprises a cap over said deformable dielectric material, and wherein said support structure includes a patterned last metal layer of said interconnect metallurgy and said cap has a thickness greater than said patterned last metal layer.

3. A semiconductor chip comprising:
a plurality of layers of interconnect metallurgy;
at least one layer of deformable dielectric material over said interconnect metallurgy;
a support structure comprising a substantially rigid dielectric connected to said deformable dielectric; and
at least one input/output bonding pad connected to said support structure,
wherein said support structure is in a supporting relationship to said pad to avoid crushing said deformable dielectric material,
wherein said metallic leg structures comprise a plurality of metallic blocks formed at progressive levels within said deformable dielectric material, and
wherein said metallic blocks form a herringbone pattern in cross-section.

4. A semiconductor chip comprising:
a plurality of layers of interconnect metallurgy;
at least one layer of deformable dielectric material over said interconnect metallurgy;
a support structure comprising a substantially rigid dielectric connected to said deformable dielectric; and
at least one input/output bonding pad connected to said support structure,
wherein said support structure is in a supporting relationship to said pad to avoid crushing said deformable dielectric material,
wherein said metallic leg structures comprise a plurality of metallic blocks formed at progressive levels within said deformable dielectric material, and
wherein said metallic blocks form a step-shaped structure in cross-section.

5. An integrated circuit chip comprising:
logic circuitry;
an external insulator covering said logic circuitry; and
a contact over said insulator electrically connected to said logic circuitry,
wherein said external insulator includes:
    a first dielectric layer having a first dielectric constant; and
    a support structure connected to said first dielectric having a second dielectric constant higher than said first dielectric constant,
wherein said support structure comprises a cap over said first dielectric layer,
wherein said external insulator includes a patterned last metal layer and said cap is co-planer with said patterned last metal layer.

6. An integrated circuit chip comprising:
logic circuitry;
an external insulator covering said logic circuitry; and
a contact over said insulator electrically connected to said logic circuitry,
wherein said external insulator, includes:
    a first dielectric layer having a first dielectric constant; and
    a support structure connected to said first dielectric having a second dielectric constant higher than said first dielectric constant,
wherein said support structure comprises a cap over said first dielectric layer,
wherein said external insulator includes a patterned last metal layer and said cap has a thickness greater than said patterned last metal layer.

7. An integrated circuit chip comprising:
logic circuitry;
an external insulator covering said logic circuitry; and
a contact over said insulator electrically connected to said logic circuitry,
wherein said external insulator includes:
    a first dielectric layer having a first dielectric constant; and
    a support structure connected to said first dielectric having a second dielectric constant higher than said first dielectric constant,
wherein said support structure includes:
    a second dielectric layer having said second dielectric constant and including a patterned last metal layer; and
    metallic leg structures extending from said last metal layer into said first dielectric,
wherein said support structure comprises a cap over said first dielectric layer wherein said leg structures comprise a plurality of metallic blocks formed at progressive levels within said first dielectric,
wherein said metallic blocks form a herringbone pattern in cross-section.

8. An integrated circuit chip comprising:
logic circuitry;
an external insulator covering said logic circuitry; and
a contact over said insulator electrically connected to said logic circuitry,
wherein said external insulator includes:
    a first dielectric layer having a first dielectric constant; and
    a support structure connected to said first dielectric having a second dielectric constant higher than said first dielectric constant,
wherein said support structure includes:
    a second dielectric layer having said second dielectric constant and including a patterned last metal layer; and
    metallic leg structures extending from said last metal layer into said first dielectric,
wherein said support structure comprises a cap over said first dielectric layer wherein said leg structures comprise a plurality of metallic blocks formed at progressive levels within said first dielectric,
wherein said metallic blocks form a step-shaped structure in cross-section.

9. An integrated circuit chip comprising:
logic circuitry;
an external insulator covering said logic circuitry; and
a contact over said insulator allowing electrically connected to said logic circuitry,
wherein said contact comprises a metallic structure extending above said external insulator,
wherein said metallic structure has a circular pillar shape.

10. An integrated circuit chip comprising:
logic circuitry;
an external insulator covering said logic circuitry; and
a contact over said insulator allowing electrically connected to said logic circuitry, wherein said contact comprises a metallic structure extending above said external insulator, wherein said metallic structure has a square pillar shape.

11. An integrated circuit chip comprising:

logic circuitry;

an external insulator covering said logic circuitry; and a contact over said insulator electrically connected to said logic circuitry, wherein said external insulator has a lattice structure including a first dielectric having a first dielectric constant and a second dielectric having a second dielectric constant higher than said first dielectric constant, wherein said lattice structure comprises a crisscross pattern of said second dielectric in a layer of said first dielectric.

12. An integrated circuit chip comprising:

logic circuitry;

an external insulator covering said logic circuitry; and a contact over said insulator electrically connected to said logic circuitry, wherein said external insulator has a lattice structure including a first dielectric having a first dielectric constant and a second dielectric having a second dielectric constant higher than said first dielectric constant, wherein said lattice structure comprises sidewall spacers of said second dielectric between portions of said first dielectric.

13. An integrated circuit chip comprising:

logic circuitry;

an external insulator covering said logic circuitry; and a contact over said external insulator electrically connected to said logic circuitry, wherein said external insulator includes support columns between said logic circuitry and said contact, wherein said support columns comprise composite metal columns filled with an insulator.

* * * * *

UNITED STATES PATENT AND TRADEMARK OFFICE
CERTIFICATE OF CORRECTION

PATENT NO. : 6,495,917 B1  Page 1 of 1
DATED : December 17, 2002
INVENTOR(S) : John J. Ellis-Monaghan et al.

It is certified that error appears in the above-identified patent and that said Letters Patent is hereby corrected as shown below:

Column 1,
Line 16, delete "input/output (UO) and mechanical support structures which" replace with -- input/output (I/O) and mechanical support structures which --

Column 4,
Line 38, delete "$\mu$m nitride, 1 $\mu$m oxide, 1 $\mu$m nitride, 1 $\mu$m oxide (nitride=" replace with -- nm nitride, 1 $\mu$m oxide, 1 $\mu$m nitride, 10 $\mu$m oxide (nitride= --
Line 40, delete "Note the initial 50 $\mu$m of nitride is only required if the oxide" replace with -- Note the initial 50 nm of nitride is only required if the oxide --
Line 50, delete "comprise a stack of 50 $\mu$m TaN, 3 $\mu$m Al (99.5%) Cu (0.5%)," replace with -- comprise a stack of 50 nm TaN, 3 $\mu$m Al (99.5%) Cu (0.5%), --

Column 6,
Line 48, delete "(i.e. BPSG, PSG, SiO$_2$, Si$_x$N$_x$H$_z$, Si$_x$C$_y$H$_z$, etc.) The col-" replace with -- (i.e. BPSG, PSG, SiO$_2$, Si$_x$N$_y$H$_z$, Si$_x$C$_y$H$_z$, etc.) The col- --

Signed and Sealed this

Seventh Day of October, 2003

JAMES E. ROGAN
*Director of the United States Patent and Trademark Office*